US009594721B1

(12) United States Patent
Marr et al.

(10) Patent No.: US 9,594,721 B1
(45) Date of Patent: Mar. 14, 2017

(54) DATACENTER EVENT HANDLING

(71) Applicant: Amazon Technologies, Inc., Reno, NV (US)

(72) Inventors: Michael David Marr, Monroe, WA (US); David Edward Bryan, Seattle, WA (US); Max Jesse Wishman, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 359 days.

(21) Appl. No.: 13/693,793

(22) Filed: Dec. 4, 2012

(51) Int. Cl.
*G06F 15/173* (2006.01)

(52) U.S. Cl.
CPC .............................. *G06F 15/17306* (2013.01)

(58) Field of Classification Search
CPC H04L 41/0213; H04L 29/08072; H04L 29/06
USPC ....................................................... 709/223
See application file for complete search history.

(56) References Cited

U.S. PATENT DOCUMENTS

| 5,235,232 | A | 8/1993 | Conley |
| 5,500,940 | A | 3/1996 | Skeie |
| 6,651,235 | B2 | 11/2003 | Dai et al. |
| 8,528,101 | B1 | 9/2013 | Beckman et al. |
| 9,116,692 | B1 | 8/2015 | Krein et al. |
| 2002/0059246 | A1 | 5/2002 | Rowe et al. |
| 2005/0066200 | A1 | 3/2005 | Bahl et al. |
| 2005/0086543 | A1 | 4/2005 | Manuell et al. |
| 2005/0188075 | A1* | 8/2005 | Dias ................ H04L 67/1008 709/224 |
| 2008/0111659 | A1 | 5/2008 | Pesapane et al. |
| 2008/0178029 | A1* | 7/2008 | McGrane et al. ............ 713/324 |
| 2008/0272887 | A1 | 11/2008 | Brey et al. |
| 2009/0125737 | A1 | 5/2009 | Brey et al. |
| 2009/0180579 | A1 | 7/2009 | Ellis |
| 2009/0281679 | A1 | 11/2009 | Taft et al. |
| 2010/0064151 | A1 | 3/2010 | Saeki et al. |
| 2010/0085152 | A1 | 4/2010 | Fukuda et al. |
| 2010/0115601 | A1 | 5/2010 | Brandstetter et al. |
| 2010/0123440 | A1 | 5/2010 | Bandholz et al. |
| 2011/0102134 | A1 | 5/2011 | Venkatesan et al. |
| 2011/0154216 | A1 | 6/2011 | Aritsuka et al. |
| 2011/0295626 | A1 | 12/2011 | Chen et al. |
| 2011/0296225 | A1 | 12/2011 | Belady et al. |
| 2012/0072745 | A1* | 3/2012 | Ahluwalia ................ G06F 1/26 713/320 |
| 2012/0086314 | A1 | 4/2012 | Bourke et al. |
| 2012/0117576 | A1* | 5/2012 | Lam et al. .................... 719/328 |

(Continued)

*Primary Examiner* — Backhean Tiv
*Assistant Examiner* — Alan S Chou
(74) *Attorney, Agent, or Firm* — Kilpatrick Townsend & Stockton LLP

(57) ABSTRACT

Systems and methods for handling resources in a computer system differently in certain situations, such as catastrophic events, based upon an assigned layer of the resource to the system. The layer can be based, for example, on criticality of the resource to the system. Services or computing device resources can be physically segregated in accordance with layers and can be managed in accordance with the segregation. In response to receiving information about an event, the different layers can be handled in accordance with their criticality, for example by shutting some of the resources down and/or slowing some of the resources down.

24 Claims, 7 Drawing Sheets

(56) References Cited

U.S. PATENT DOCUMENTS

| | | |
|---|---|---|
| 2012/0243157 A1 | 9/2012 | Chen et al. |
| 2012/0304195 A1 | 11/2012 | Periorellis et al. |
| 2013/0054536 A1 | 2/2013 | Sengupta et al. |
| 2013/0055247 A1 | 2/2013 | Hiltgen et al. |
| 2013/0188512 A1 | 7/2013 | Norris et al. |
| 2014/0039683 A1 | 2/2014 | Zimmermann et al. |
| 2014/0056132 A1 | 2/2014 | Lim et al. |

\* cited by examiner

DATACENTER EVENT HANDLING

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting and other web services. Server farms are increasingly being used by enterprises instead of, or in addition to, mainframe computers. As a result, it is a common expectation that a datacenter's computer resources be available, even in times of catastrophic events.

BRIEF DESCRIPTION OF THE DRAWINGS

Various embodiments in accordance with the present disclosure will be described with reference to the drawings, in which.

DETAILED DESCRIPTION

Figure 1:
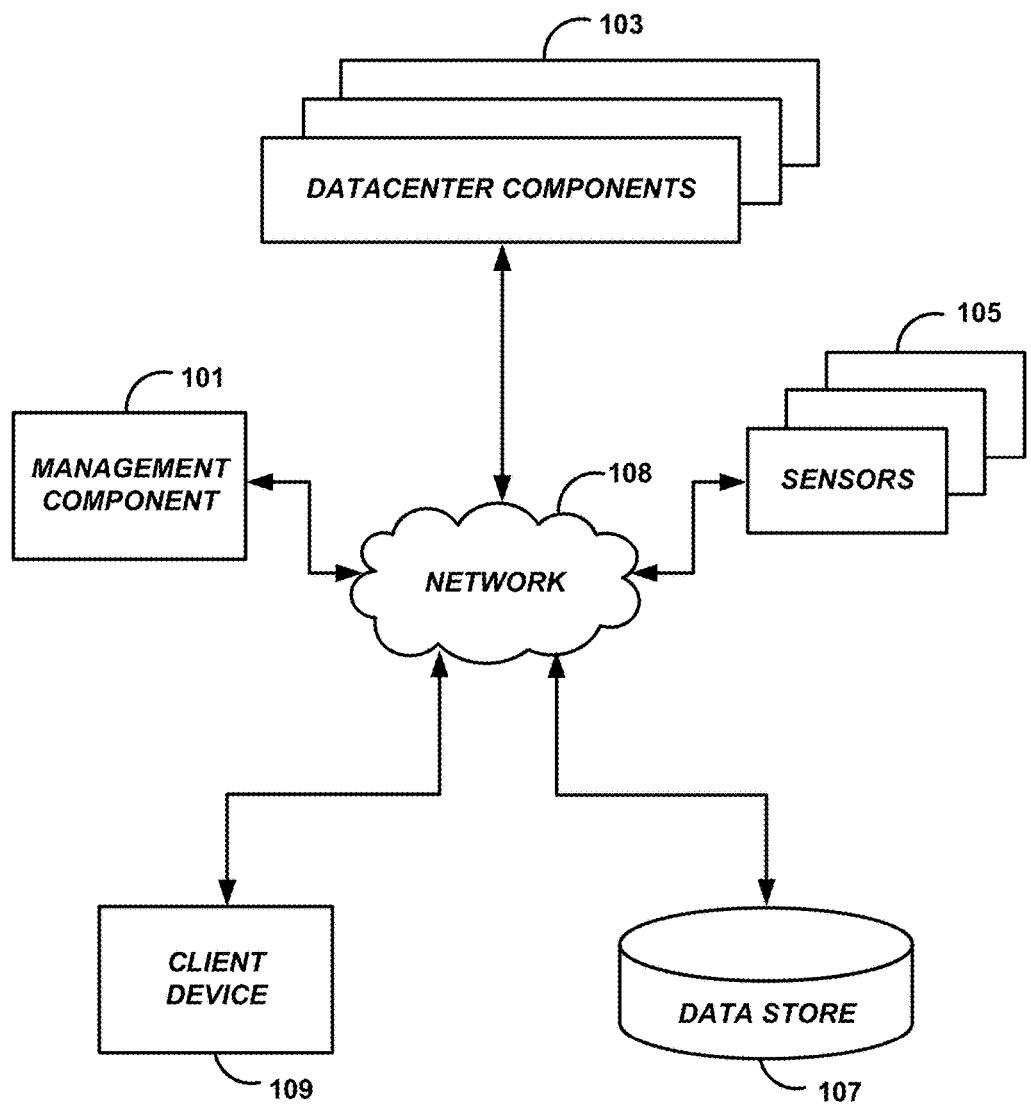
FIG. 1 is a block diagram of an illustrative datacenter environment including a management component in accordance with embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Generally described, the present disclosure relates to the management of computing device resources, such as datacenter components in a datacenter. Embodiments herein are directed to treating resources differently in certain situations, such as catastrophic events, based upon the criticality of the resource to the system.

As an example, services or devices can be assigned a criticality level representing a layer, such as 1, 2, 3 and so forth. The different layers can be treated differently in the case of an event, such as fire, a power outage, an overheating situation and so forth. In response to receiving information about such an event, the different layers can be handled in accordance with their criticality. As an example, as in the case of a power outage, battery resources can be allocated to a more important layer or layers and less important layers can be gracefully shut down and/or slowed down. In embodiments, one or more criticality thresholds can be defined, above which all layers are treated the same (e.g., allowed to continue to operate) and below which all layers are treated in another manner (e.g., run at a slower processor state). As an example, in a power outage, layer 1 and 2 computing device resources may remain active, whereas layer 3 and lower layers can be shut down or slowed down.

In alternate embodiments, multiple thresholds can be defined above and below which layers are treated differently. In additional embodiments, each layer of criticality can be handled differently in the case of an event. In the case of additional events, operation of layers can be changed again to reflect new conditions.

In addition, in embodiments, services or computing device resources can be physically segregated in accordance with layers and can be managed in accordance with the segregation. As an example, critical layers can be fenced off or otherwise made not available except to users with secure clearance or authorization.

In addition, a light or other indicator (visual, auditory, sensory or otherwise) can be provided for indicating that a datacenter component is in a particular layer. The indicators can be at a device level, rack level and/or room or area level. In embodiments, only critical layers may have an indicator. In other embodiments, each layer may have a different light (e.g., red for layer 1, blue for layer 2, green for layer 3 and so forth.

Services can be segregated so that all services on a single computing device and/or on a rack of computing devices are at the same layer. Multiple racks having the same layer may be segregated to a single area of a datacenter, such as a room, for example. If desired, security levels can be set within a datacenter so that technicians without access privileges do not have access to more critical order layers.

If a single device includes services at different layers, the services on that single device can be treated in a different manner during or after an event. For example, one service can be shut down while another remains active.

In embodiments, in response to an event, some layers can be set at slower processing states, such as higher P states, or set to inactive using higher C-states. As examples, some layers can be made less active as a result of an event, such as a disruption to power distribution or overheating of a room. Making some layers less active results in less power use and/or heat generation. Also, as described above, instead of slowing down a component, a graceful shutdown of the component may occur such as through server hibernation or operating system (OS) shutdown.

Embodiments herein can be used in any environment utilizing multiple components, but for ease of description, a datacenter is described. Embodiments herein are directed primarily to management of hardware components that are connected together by a network and that share a common resource, such as power or cooling capability. By "components," we mean both hardware and software components, thus including both devices and services. Thus, as part of management, multiple services can reside on a same device and can be handled differently. Alternatively or additionally, a device can be handled in accordance with an assigned layer, regardless of whether services that are assigned different layers are located on the device. In one embodiment, the server hardware can be assigned a layer that is equal or more critical than the most critical service operating on the server hardware.

An example datacenter environment or datacenter 100 is shown in FIG. 1. The datacenter 100 includes a management component 101, multiple datacenter components 103, sensors 105, a data store 107 and a client device 109. The various components may communicate via a network 108. In some embodiments, the datacenter 100 may include additional or fewer components than those illustrated in FIG. 1. For example, the number of datacenter components 103 may vary substantially; there may be no sensors 105 and so forth. Typically, components of the datacenter 100 are located in a single building or connected buildings, but one or more of the components, such as the management component 101 and/or the client device 109, can be located remote of the datacenter building complex and can be accessed remotely via the network 108.

The management component 101 can receive data from a number of sources, correct errors and reconcile data from one source to that of another, maintain and/or retrieve layer information about components in the system, generate instructions on handling of components and respond to queries from the client device 109. For example, the management component 101 may receive data regarding the datacenter components 103 and operational characteristics of the datacenter components directly from the datacenter components, from the sensors 103, from the data store 107, from data entry (e.g., via the client device 109), or from some other source. As described below, the data may indicate the location, power system connectivity or status, temperature, battery condition or status, or other relative information about the datacenter and the various datacenter components 103. The management component 101 can reconcile the data received from the disparate sources (e.g., temperature data from a sensor integrated with a datacenter component 103 against data from an independent sensor 105 nearby) and generate instructions for handling the datacenter components 103. In some embodiments, the management component 101 can generate an alert to request human interaction with the device, for example in accordance with a playbook. In other embodiments, the management component 101 can generate instructions that are received by the datacenter component 103 to cause the datacenter component to react accordingly, e.g., to change state and/or operation.

The management component 101 and/or the client device 109 can be computing devices, such as server computers or desktop computers, configured with various hardware and software modules to implement the processes described herein. In addition, the management component 101 and/or the client device 109 can be physically located within a datacenter and thus may also be operating on datacenter components 103. In some embodiments, the management component 101 or the client device 109 may be remote from the datacenter. If desired, the management component can be integrated with the client device 109 or physically co-located on the same computing device.

A user, such as a datacenter administrator or technician, can use the client device 109 to assign layers to datacenter components 103 and assign criticality to the layers that are managed by the management component 101. Layer and/or criticality information can also be automatically associated with particular datacenter components 103. For example, network hardware can always be assigned the highest level of criticality. In addition, criticality can be related to the component's relative connectivity to other components. For example, "core routers" are higher criticality than top-of-rack switches, even though they may all be the same kind of switch. The difference can inferred automatically based on the logical or physical connectivity of the switch to other devices in the network. The management component 101 can store this information, for example in the data store 107 and, upon receiving information about an event, such as a power outage, can handle or otherwise instruct the datacenter components 103 to be handled in accordance with their layer criticality.

Figure 2:
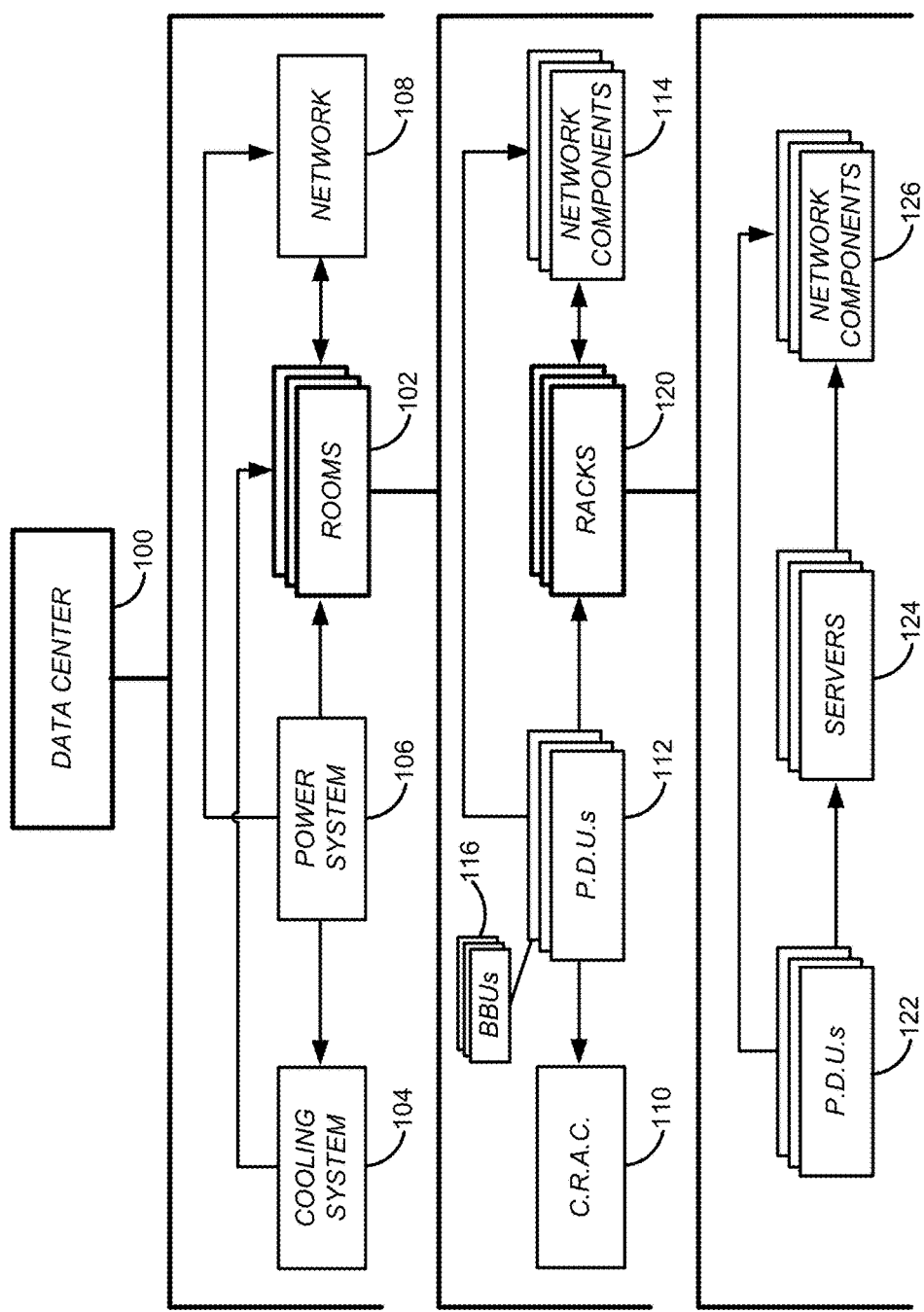
FIG. 2 is a block diagram of an illustrative datacenter hierarchy including datacenter components in accordance with embodiments.

FIG. 2 illustrates an example of datacenter components 103 that may be monitored by the management component 101 of FIG. 1, or some other component. The various datacenter components 103 may be included in implementation of the datacenter 100 to provide computing capacity, storage and other services to any number of customers or internal users. In some embodiments the datacenter 100 may have more or fewer components than are illustrated in FIG. 2.

A datacenter 100 may be part of a larger computing system operated by a network computing provider that includes several datacenters 100 across any number of geographical areas. The various datacenters 100 may communicate via a network, which can be the network 108 or another network. The network may be a wide area network (WAN), a collection of networks operated by distinct entities, such as the Internet, or some other network. The network computing provider can provide computing and storage capacity to a single operator, such as a single enterprise, such as a company or university. The computing services may include web hosting, data backup and mirroring, disaster prevention co-locations and the like. In another embodiment, the network computing provider provides such computing services and storage capacity to a variety of independent customers, such as a number of different business entities. In yet another embodiment, the network computing provider can provide computing services and storage capacity to users in the general public.

Customers may access the services on-demand or on a subscription basis. In some embodiments, the customers of the network computing provider may specify or select a particular computing device hardware and software configuration to use. Customers may then connect to a different physical computing device which satisfies the chosen hardware configuration each time the customer initiates a computing session. Virtual machine images of the chosen software configuration may be dynamically loaded or instantiated on a computing device as part of a computing session initialization process. In some embodiments, the software may not be a virtual machine image and the computing device need not be a different computing device for each computing session.

As illustrated in FIG. 2, a datacenter 100 may include any number of rooms 102 in which computing devices and other datacenter components 103 that provide the services described above, or which support components which provide the services, are physically located. The datacenter 100 may also include a cooling system 104, a power system 106 and a network 108. For example, a datacenter 100 typically has a power system 106 that connects to a power source, such as the local power grid. The power system 106 may include a power generator for backup or as a primary power source. The power system 106 provides power to the various datacenter components 103, including the cooling system 104, the network 108 and also the rooms 102.

The various components 103 of the datacenter 100 may emit heat that can be harmful to the function of the components themselves and to other components nearby. Therefore, the datacenter 100 may include a cooling system 104, such as an air conditioner, that regulates the temperate of the datacenter 100 and its various rooms 102 and components. In some embodiments, a more powerful or more efficient cooling system 104 may be provided instead of, or in addition to, an air conditioner. For example, some datacenters 100 may include a cooling loop that circulates chilled water throughout the datacenter 100 and various rooms 102 thereof and a condenser or evaporative waterfall to cool the water after it has absorbed heat from the datacenter 100 components.

The datacenter components 103 associated with the datacenter 100 can also communicate with each other and with components outside of the datacenter 100 via a network 108. The network 108 can be provided by a number of components, such as routers, switches, hubs and the like. The network 108 components may communicate via cables or wirelessly. The network 108 can provide connectivity between the various rooms 102 of the datacenter 100 and to one or more network links outside of the datacenter 100, for example to the Internet or a WAN. In some embodiments, there may be several core switches and/or routers with which the network components of the various rooms 102 communicate to provide redundancy and fault tolerance.

FIG. 2 is a block diagram representing a hierarchy of the datacenter 100 in accordance with embodiments. Broadly described, as shown by the hierarchy in the drawing, the datacenter 100 includes rooms 102, which in turn include racks 120. The racks 120 include servers 124 and/or network components 126. The resources provided by the cooling system 104 (i.e., heat removal), the power system 106 (i.e., power) and the network 108 (i.e., data communication) are shared by at least some of the datacenter components 103 and can be shared, as examples, at a given hierarchy level (e.g., at a rack level, a room level, or for the entire datacenter 100).

A room 102 of the datacenter 100 illustrated in FIG. 2 can encapsulate a number of datacenter components 103 and further hierarchical levels. For example, a room 102 may include any number of racks 120 of computing devices, a cooling system 104 component such as any number of computer room air conditioning (CRAC) units 110, any number of power system 106 components such as power distribution units (PDUs) 106 and any number of network components 114 in communication with the network 108 of the datacenter 100.

The PDUs 112 may include one or more room-level PDUs 112 which each serve power to several racks 120. In such cases the room-level PDUs 112 may connect to rack-level PDUs 122 via cables and power whips. The rack-level PDUs 112 can then distribute power to the devices of the rack 120 as described below. In addition, the room-level PDUs 112 can provide power to the CRAC unit 110 and the network components 114.

The network components 114 include room-level switches and/or routers which facilitate communication between the computing devices housed in the racks 120, described below and the network 108 of the datacenter 100. For example, a room-level switch 114 may facilitate communication between computing devices on separate 120 racks within the same room. Additionally, the room-level switch 114 may, in combination with the core routers of the datacenter 100, facilitate communication between computing devices in different rooms 102, or even different datacenters 100 and other computing devices outside the network computing provider environment.

A rack 120 may be any frame or enclosure capable of mounting one or more servers or other computing devices. For example, the rack 120 can be a four-post server rack, a server cabinet, an open-frame two-post rack, a portable rack, a LAN rack, combinations of the same, or the like. In some embodiments, the computing devices mounted on the rack 120 may be networking components 126, such as switches or routers, instead of or in addition to servers. For example, a datacenter room 102 may have, in addition to racks 120 which contain servers 124, one or more racks 120 which may contain any number of switches. In some embodiments, a datacenter room 102 may contain only one rack 120, or may contain zero racks 120. For example, a datacenter room 102 may have servers 124 embodied as one or more large-scale computing devices, such as computing appliances or midrange computers, which may not be grouped together physically in a rack 120.

A rack 120 may also encapsulate a number of datacenter components 103 and additional hierarchical levels, such as PDUs 122, servers 124 and network components 126. For example, a rack 120 may include any number of PDUs 122 and other datacenter components 103, such as power whips and the like, for providing power from the room-level PDUs 112 to the servers 124 and network components 126 mounted in or associated with the rack 120. The network components 126 of the rack 120 can include top-of-rack (TOR) switches which provide network connectivity between the room-level network components 114 and the servers 124. The network components 126 can also be powered by the rack-level PDUs 122.

Each server 124 can comprise additional datacenter components 103, each of which may be monitored, such as a processing unit, a network interface, computer readable medium drive and a memory. The memory generally includes RAM, ROM and/or other persistent or non-transitory memory and may contain a hypervisor for managing the operation and lifetime of one or more virtual machine (VM) instances. In some embodiments, the VM instances are also datacenter components 103 which can be assigned a layer and can be managed by the management component 101 of FIG. 1. In other embodiments, application software or services operating on other datacenter components 103 can also be considered datacenter components that can be assigned layers and be managed by the management component 101. Thus, the management component 101 can manage devices and/or software, including software services such as VMs, in accordance with the processes described herein.

As described above, servers 124 can be configured to host VMs at the request of customers of the network computing provider operating the datacenter 100. For example, a business entity may rent computing and storage capacity from the network computing provider and may choose a VM configuration or have a VM machine image customized for their needs. A single server 124 may at any time have one, two, or (possibly many) more VMs operating on behalf of customers, actively processing data, responding the customer requests and the like. In some embodiments, the VM's on a given server may be operating on behalf of one, two or possibly many different customers. In some embodiments, the server 124 need not host VMs and therefore the server 124 may not have a hypervisor or VMs in memory.

In operation, a customer may initiate processing on a server of the datacenter 100 by transmitting network communications via the Internet to the datacenter 100. The communications can be routed through the network 108 of the datacenter 100, passing through a core switch and to a room-level network component 114, such as a switch, of a particular room 102. From there, the communications are passed to a rack 120, where they pass through a rack-level network component 126, such as a TOR switch, before ultimately arriving at a server 124. The server 124 may be a fixed host which performs internal processing, such as routing the communication to another server 124 where a VM for the customer will be launched to process the communication and provide the customer computing session. As will be appreciated, such an operation can involve additional communications sent over multiple rack-level network components 126, room-level network components 114 and components of the network 108 of the datacenter 100 before arriving at a server 124 that will launch a VM for the customer in a different room 102 of the datacenter 100.

The server 124 which launches the VM for the customer may receive power, through a power cable, from a rack-level PDU 122 of the rack 120 on which the server 124 is located. The rack-level PDU 122 may in turn receive power through one or more "power whips" or cables from a room-level PDU 112. The power may pass through any number of PDUs in between the rack-level PDU 122 and room-level PDU 112. The room-level PDU 112 can draw power from the power system 106 of the datacenter 100. The power may come from another PDU or directly from an on-site generator or power source, or from a link to the local power grid outside of the datacenter 100. One or more battery backup units (BBUs) 116 can be provided for use in a power failure. A BBU 116 can be dedicated to a rack 120 of datacenter components 103, a single datacenter component (e.g., connected to or associated with the PDU 122), or more than one datacenter component, which can be located on one or more racks.

Each datacenter component 103 involved in the illustrative communication described above can generate heat as the datacenter component 103 transfers power or communications, or performs other computing operations. Heat can cause the datacenter component 103 which generates the heat to become damaged or otherwise malfunction and similarly impact nearby components, such as wiring, servers 124, network components 126, 114, PDUs 122, 112, etc. In order to dissipate the heat, a room-level component of the datacenter cooling system 104 may be used, such as a CRAC 110. In some embodiments, rack-level cooling units may also be implemented, including fans, pipes carrying chilled water and the like. Either rack-level or room-level cooling components and systems may be connected to a datacenter cooling system 104, such as a chiller loop. As will be appreciated, the cooling components of the datacenter 100 may also be coupled to the power system 106 of the datacenter 100, as described above with respect the servers 124 (i.e., fans, compressors and pumps typically require electrical power to operate). The sensors 105 can be used to determine the amount of heat that needs to be removed from a room 102 and/or a rack 120 and/or datacenter components 103 can include their own heat sensors.

Figure 3:
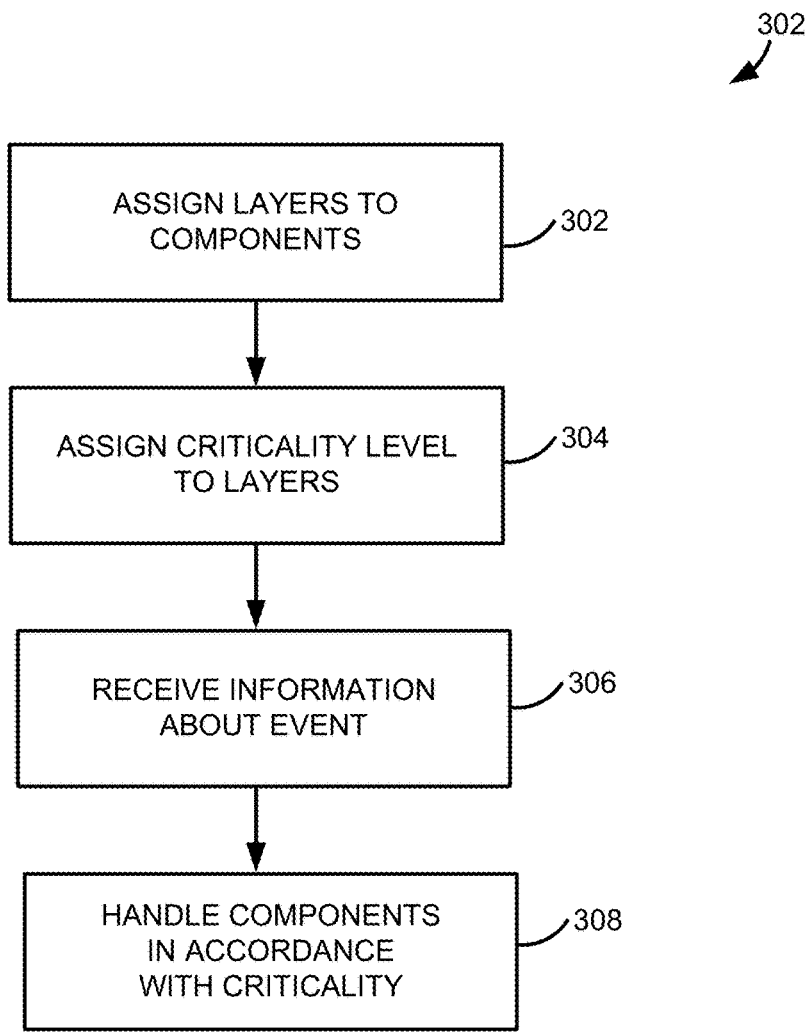
FIG. 3 is a flow diagram of an illustrative process for handling datacenter components in accordance with embodiments.

FIG. 3 is a process 300 for handling services or devices in accordance with embodiments. Some or all of the process 300 (or any other processes described herein, or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

At 302, criticality layers are assigned to datacenter components 103. These layers are based upon the criticality of the devices or services of the datacenter components 103 and may be input by a user at the client device 109 (e.g., via a user interface or other selection or entry option) or may be automatically generated by the management component 101 based upon what the datacenter component is, for example automatically assigning a highest layer to a network component 114 or 126. In embodiments, the more critical datacenter component 103 is, the more important the layer that is assigned to the device or service. Alternatively or additionally, a client can purchase services from the datacenter 100 and express the level of criticality of their workloads operating on the data center components. In some embodiments, these clients may pay extra or otherwise trade default capabilities of datacenter components (e.g., computing resources assigned to a VM) in exchange for their assigned components being handled with higher criticality.

In the following examples, the highest criticality of services designated by the numeral "1" with increasing numbers representing less critical services. However, any designation can be used to represent criticality of a device or service.

Figure 4:
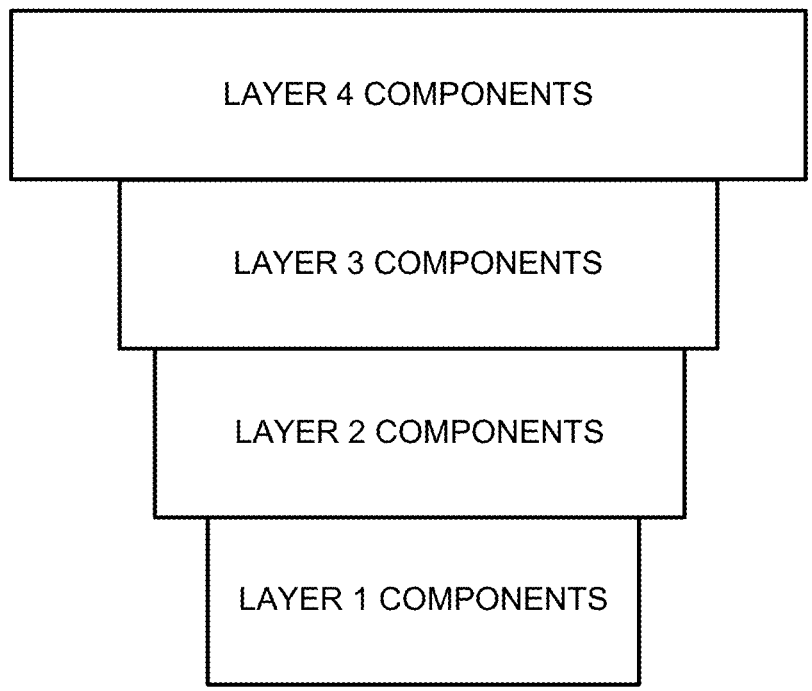
FIG. 4 is a block diagram representing a hierarchy of layers of datacenter components in accordance with embodiments.

As an example, FIG. 4 shows a hierarchy for datacenter components 103 in accordance with embodiments. In these embodiments, layer 1 devices and services in the datacenter will be those devices and services that are most critical to operation of the datacenter. Examples of layer 1 datacenter components 103 can be the pre-boot execution environment (PXE), Dynamic Host Configuration Protocol (DHCP) or other assignment of Internet protocol (IP) addresses, network switch configuration services for network components 114 and so forth. Typically, there are fewer layer 1 datacenter components 103 than layer 2 and higher layers and the smaller base in FIG. 1 generally represents the number of components in that layer, with layer 1 being the base and others relying on higher criticality (lower layer number) or equal layer datacenter components 103. Thus, in general, in the embodiment shown in FIG. 4, layer 2 devices and services rely upon layer 1 or layer 2 devices and services for operation and layer 3 devices and services rely on layer 2 and 1 devices and services for operation and so forth. In addition, devices and services can be dependent upon devices and services at the same level. However, this structure is not required and device and service criticality can be set by a user (e.g., an administrator) in accordance with a preference instead of a need for a more critical layer. For example, in some embodiments, a "more critical" layer may take dependencies on a less critical layer by applying a variety of resiliency techniques, such as relying on redundancy or limiting the impact of particular failures through "fallback designs".

In some embodiments, customer expenditures, such as a one-time fee or recurring charges, can be taken into account. As an example, as described above, a VM service may be set at a higher criticality based upon the price a customer is paying for the VM service. This criticality can be set by moving a datacenter component 103 to a more critical layer based upon a customer expenditure, or moving a customer's service to a more critical layer datacenter component 103.

As a result of the layers being assigned to the devices and services at 302, a criticality level is assigned to each of the layers at 304. This criticality level may be assigned as part of process of assigning the layers in 302 and may be designated by numbers or other information. The information regarding criticality levels is maintained for access by the management component 101, for example in the data store 105.

At 306, information is received, for example by the management component 101, about an event. The event may be, for example, a power outage, a low voltage or amperage situation, cooling issues in the datacenter 100, a fire in the datacenter 100, or some other event. The information may come from the sensors 105, the datacenter components 103, information received from the network 108 or the client device 109, or another source. At 308, the services and/or devices are handled in accordance with the criticality levels. As set forth above, different criticality levels can be treated differently depending on the event.

In general, the management component 101 manages use of a resource (e.g., power, heat removal, network bandwidth, etc.) that is used by multiple datacenter components 103. The event that the management component receives can be that the resource is not maintaining portions of the datacenter 100 within defined parameters. For example, part of the datacenter may be too hot, there can be insufficient power or a power failure, network resources may be down, etc. The management component 101 can respond to this altered condition by changing operation of some of the datacenter components 103 to relieve the resource, for example by slowing down or shutting down some resources so as to reduce power consumption, heat production and/or network use.

As an example, in the case of a power outage and where the datacenter goes on battery backup prior to going onto generators, some less critical services and/or devices can be slowed down or shut down so as to preserve resources for the more critical devices. These features can allow the more critical datacenter components 103 to operate, as power is preserved for those resources. If another event occurs, such as a failure of the generator to start after a prescribed period of time, then a different level can be set for datacenter components. In some embodiments, power failures may result in reduced cooling or network capacity, so other remedial workflows may be implemented to address these additional conditions which may likewise continue beyond the full or partial restoration of operating power.

As another example, in a case of overheating, some services and/or devices may be shut down or slowed down so that less cooling is needed for the datacenter 100. In this example, the number of devices and/or services that are shut down can depend upon information received from the sensors 105 regarding how much the datacenter 100 is overheated. The devices and/or services that are shut down can be specific to a particular room 102. Thus, layers may be handled with respect to a particular room 102, rack 120, or datacenter component 103. Levels can continue to change as the situation changes (e.g., layers can be more active as the room cools, or become even less active if the room gets hotter). A particular room 102, rack 120, or datacenter component 103 may be handled in accordance with the layers in that room, rack or datacenter component. Thus, the management component 101 may handle only a subset of devices or services in the datacenter 100 based on information received from the sensors 105 or other information received regarding power, heat, or other events. That subset can be based, for example, on location of the datacenter components 103 in the datacenter 100.

In other examples, the management component 101 can change the state of a computing device (e.g., one of the datacenter components 103) to modulate its processor(s) to slow down or shut down upon an event. Doing so would slow heat production by and/or power consumption of the computing device. In some embodiments, this might involve configuring or adjusting the processor performance state (P-state), processor operating state (C-state), processor sleep state (S-state), device power state (D-state), global system state (G-state) or similar power management feature where putting the system in a "higher state" (e.g., P3) typically consumes less power than at a "lower state" (e.g., P1)." In embodiments, the management component 101 can provide information to change the state of datacenter components 103 in a particular layer. The datacenter components 103 can also be limited to a particular area of a datacenter, such as a room 102 or a rack 120.

D-states are device power states and typically managed by a combination of the server operating system (OS), device driver and/or device firmware. For example, putting a spinning magnetic hard drive into a higher D-state may result in the hard drive "spinning down" until it is set back to D0/active. D-states are typically adjusted in conjunction with C-states to conserve overall system power when the platform wouldn't otherwise be actively processing anyway.

P-states are really sub-states of C-state 0 (C0)—i.e. the processor is always in C0 when P-states impact anything in the processor. Higher P-state numbers typically represent slower processor speeds. Power consumption is lower at higher P-states. For example, a P3 state is higher than a P1 state. A processor in P3 state will run at a lower clock frequency (i.e. "slower") and use less power than a processor running at P1 state. In higher C-states, the processor shuts down various internal functions—notably, instruction pipelines are "halted" even in C1 so it is not processing general purpose programs and only responds to certain interrupts (for which it kicks the processor back into C0 to service them). Higher C-states take longer to recover from for both electrical engineering reasons (e.g., adjustment time on PLL voltage or reactivating processor clock) and also because processor state is abandoned (e.g., caches are flushed and invalidated).

C-states are sub-states of S-state 0 (S0 "active"): C0 (operating), C1/C1E (halted), C3 (sleeping), C6/C7 (deep sleeping). Although C3-C7 are frequently described as "sleep states", the processor is considered "active" from an overall S-state perspective. S-states represent different degrees of sleep beyond this. Higher S-states put the platform (e.g., CPU package, voltage regulator, RAM) into progressively lower power states which likewise take progressively more time to return back to an active state. Under the hood, this corresponds to shutting down more and more parts of the processor package, reducing RAM refresh rates, flushing more system state to persistent storage (e.g., S4/"hibernate" flushes the RAM working set to disk), etc.

G-states are a logical concept of the overall state of the platform and typically not a settable power state per se. G0 ("Working") implies the processor is in S0. G1 means the processor is in a "sleep state": S1, S2, S3 or S4. G2 implies S5 or "Soft Off"—basically, the system must be fully booted to return it to an active state. G3 is "Mechanically Off"—there is no power into the server and it cannot be booted until power is restored. G-states could be a convenient way to express power management control logic of other state classes (e.g., S-states and D-states), Baseboard Management Control (BMC) functionality, etc.

As an alternative to changing the state of processor of a datacenter component 103, the performance and/or operation can be reduced by a percentage or some other measure. For example, a datacenter component 103 can have operation reduced 50%, 25%, or any percentage that appears to be sufficient to overcome the event. For example, if temperature is sensed to be substantially above acceptable, some datacenter components 103 can be reduced 75% in operation (slowed down this amount, or power consumption reduced by this amount), whereas others can be reduced less (e.g., 50%) if those others are in a more critical layer.

Figure 5:
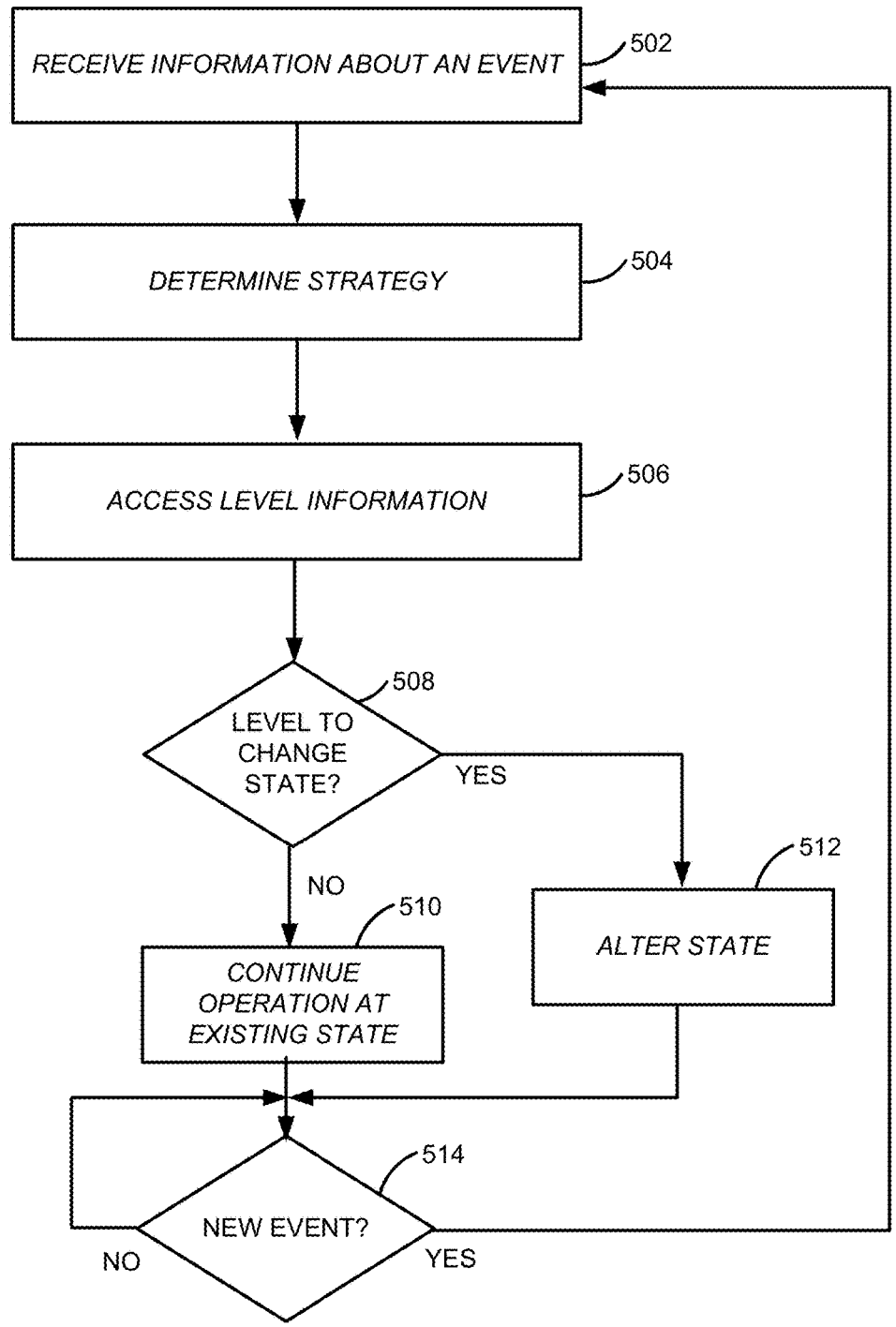
FIG. 5 is a flow diagram representing a process for setting states of datacenter components in accordance with embodiments.

FIG. 5 shows a process 500 for handling datacenter components 103 responsive to events and layers of the datacenter components in accordance with embodiments. At 502, information is received about an event, for example by the management component 101. In general, an event is a situation where the datacenter 100 or portions of the datacenter are not operating in accordance with a set of nominal conditions. The event can be, for example, a change of temperature of a room 102 and/or at a rack 120 to outside defined conditions and/or a power outage or power drop in the datacenter 100 or a room 102 of the datacenter below nominal conditions.

At 504, a strategy is determined for the event. The strategy is information about how to handle each layer of datacenter components 103 responsive to the event. The datacenter components 103 that are relative can depend upon the location of an event and can be particular to a room 102, a rack 120, or the entire datacenter 100, as examples. The strategies are typically available prior to an event and can be input by a user at the client device 109, can be provided as a package to installers of datacenters, or can otherwise be available as a plan for action in the case of an event. The strategies can be maintained in a playbook, or can be stored in the data store 105 for access during an event. The strategy for a particular event can include the same action for all layers, the same action at some layers but different at others, or can be different actions for each of the layers. Not necessarily all layers will be impacted in a strategy. For example, some layers can continue to operate at a normal or existing state. One strategy can be, for example, to reduce power to layer 3 and 4 datacenter components 103 to 25%, to layer 2 datacenter components 103 to 50% and layer 1 datacenter components to 75%.

At 506, the layer information about the affected datacenter components 103 is accessed. This layer information can be stored, for example, in the data store 105. As discussed above, the layer information is generally information about a layer to which each of the datacenter components 103 is assigned. At 508, a determination is made if state is to be changed for a particular datacenter component 103. This decision is made by evaluating the level of the datacenter component 103 obtained at 506 and determining from the strategy obtained at 504 if the state of the datacenter component is to be changed. If the state is not to be changed, then 508 branches to 510, where the service or device is kept at its current state. If the state is to be changed, then 508 branches to step 512, where the service and/or device is adjusted to the lower state. The altered state can be, for example, a C-state sleep level, a lower speed processing (higher P-state), or operation set to a percentage of full operation, such as at 50% power or 50% clock frequency. In any event, operation then continues, with the datacenter components 103 now operating according to the new strategy.

If another event occurs, such as the temperature of a room 102 going above another level or does not return to acceptable levels within a determined time period, then the process branches from 514 back to 502. A new strategy is then accessed and the affected datacenter components 103 can be handled according to the new strategy. Until a new event occurs, 514 continues to loop.

As indicated above, the process in FIG. 5 could be utilized to adjust the state of each of the layers of datacenter components 103, or can adjust the state of only a subset of the layers. For example, in response to an event, layer 1 devices can continue at normal state, layer 2 devices might be set to operate at P2, layer 3 devices at P3 and layer 4 devices at C1.

Layer criticality can be used in other ways to manage the datacenter 100 or data center component planning. For example in embodiments, the topology/configuration of a datacenter can be arranged according to layers, with groups of datacenter components 103 in the same layer being placed in the same location together. One or more of these layers can be managed because of their location, for example by having a more critical layer (e.g., layer 1) in a locked area or cabinet with limited access. Likewise, more critical data center areas may have additional resources, such as redundantly supplied power, additional networking capability, or more resilient cooling designs (e.g., employing volumes of high heat capacitance Phase Change Materials that can provide a period of fan-only cooling if CRAC units are inactive).

Figure 6:
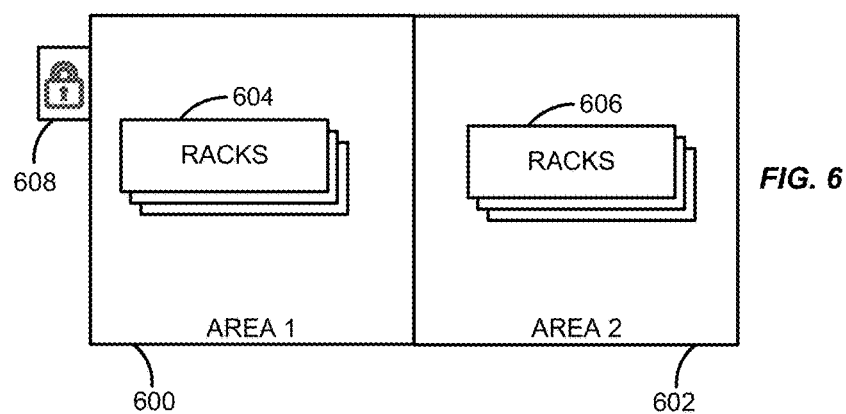
FIG. 6 is a block diagram representing segregation of datacenter components in accordance with embodiments.

For example, as shown in FIG. 6, areas 600, 602 may be defined within the datacenter 100. The first area 600 includes racks 604 (e.g., the racks 120) and the second area includes the racks 606 (e.g., also the racks 120). The areas 600, 602 are separated from each other by a fence, walls, or some other structure. In the drawing, walls are shown around both areas, but different embodiments may elide requirements for physical barriers or provide only partial walls or barriers, employ security cameras or simply visual indicators of area segregation. In the depicted embodiment of FIG. 6, the devices and/or services on the racks 604 are a layer or layers that are more critical than the racks 606. As an example, the area 600 may be all layer 1 components.

In embodiments, the racks 604 are segregated from the other racks 606 due to their heightened criticality and therefore layer. A lock or other security device 608 can be provided for the rooms 602 to prevent tampering or otherwise altering the state of the room 602. The lock may be a physical device, such as a deadbolt requiring key access, security cameras, motion sensors or can be software security, requiring password authorization or some other security level clearance for implementing the processes described herein.

If a physical lock or other physical barrier is used for the security device 608, technicians are prevented from turning off machines in an emergency situation, where panic or a lack of proper instructions may cause operators to shut down machines without following a particular protocol. If the devices or services in the area 600 are critical to operation of the datacenter 100, proper authorization, such as obtaining the person who has a key or secured access authorization to the management component 101 would be required for shutting down these critical services or devices. As an alternative to the segregation of racks 604, 606 in FIG. 6, devices or services can be separated by racks 120, rooms 102 and/or datacenter components 103.

Figure 7:
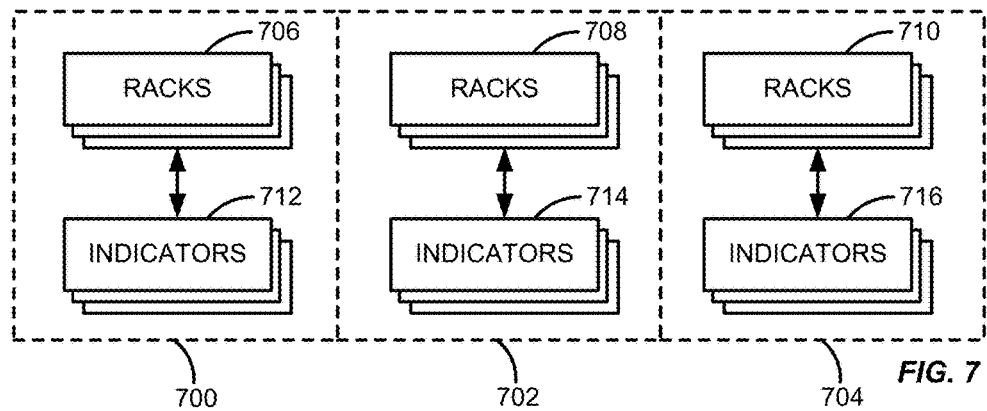
FIG. 7 is a block diagram representing indicators for providing layer information regarding datacenter components in accordance with embodiments.

As an alternative to the physical segregation in FIG. 6, devices or services can be separated by racks 120, rooms 102 and/or datacenter components 103 and indicators can be utilized to indicate a particular layer of the room, rack or datacenter component. As an example, as shown in FIG. 7, three different sets 700, 702, 704 of racks 706, 708, 710 include respective indicators 712, 714, 716 for providing an indication of the particular level of layer for the devices and/or services in the racks 706, 708, 710. In embodiments, the indicators may be different color LEDs on specific datacenter components 103. As an example, a layer 1 datacenter component 103 could have a red light, a layer 2 datacenter component could have a blue light and a layer 3 datacenter component could have a green light. As an alternative, only particular layers may include indicators. As an example, an indicator, such as a red light, may be provided only on layer 1 devices or services. This indicator could be, for example, a large red light on top of racks 120 that include layer 1 datacenter component 103.

Thus, indicators can be used at any level (e.g., rack 120, room 102 and/or datacenter component 103) to indicate a layer. Operators can use such indicators to react appropriately, for example in the case of emergency. As an example, where a fire occurs in a portion of a datacenter and operators need to shut down some resources, those operators can avoid shutting down layer 1 (or layer 1 and layer 2, etc.) resources in the datacenter 100 by observing and avoiding "red-lit" areas.

Figure 8:
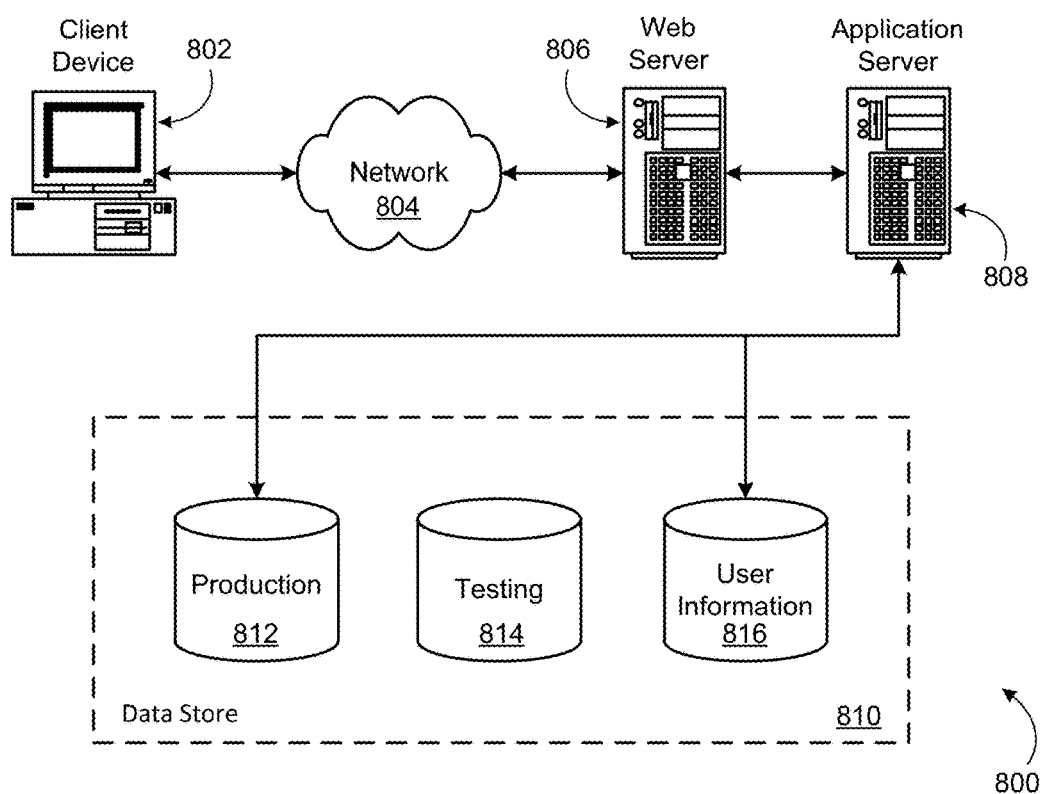
FIG. 8 illustrates an environment in which various embodiments can be implemented.

FIG. 8 illustrates aspects of an example environment 800 for implementing aspects in accordance with various embodiments. As will be appreciated, although a Web-based environment is used for purposes of explanation, different environments may be used, as appropriate, to implement various embodiments. The environment includes an electronic client device 802, which can include any appropriate device operable to send and receive requests, messages or information over an appropriate network 804 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio and/or video to be transferred to the user, which may be served to the user by the Web server in the form of HyperText Markup Language ("HTML"), Extensible Markup Language ("XML") or another appropriate structured language in this example. The handling of all requests and responses, as well as the delivery of content between the client device 802 and the application server 808, can be handled by the Web server. It should be understood that the Web and application servers are not required and are merely example components, as structured code discussed herein can be executed on any appropriate device or host machine as discussed elsewhere herein.

The data store 810 can include several separate data tables, databases or other data storage mechanisms and media for storing data relating to a particular aspect. For example, the data store illustrated includes mechanisms for storing production data 812 and user information 816, which can be used to serve content for the production side. The data store also is shown to include a mechanism for storing log data 814, which can be used for reporting, analysis or other such purposes. It should be understood that there can be many other aspects that may need to be stored in the data store, such as for page image information and to access right information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 802. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-layer applications, including Hypertext Transfer Protocol ("HTTP") servers, FTP servers, Common Gateway Interface ("CGI") servers, data servers, Java servers and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A computer-implemented method for managing datacenter components in a datacenter, comprising:
    under the control of one or more computer systems configured with executable instructions:
        receiving, from a client device, an indication of a specified datacenter component and a criticality level of the datacenter component, the criticality level being associated with an assigned layer;
        maintaining information about a plurality of datacenter components in a datacenter that includes the specified datacenter component and a plurality of layers, the information including, for each of the plurality of datacenter components, an assigned one of the plurality of layers for the datacenter component, the specified datacenter component being assigned to the assigned layer;
        accessing layer information for each layer of the plurality of layers, the layer information including information on usage of a resource for the layer of the plurality of layers, the usage of the resource for the layer being determined from operational characteristics of each datacenter component, the operational characteristics provided by each datacenter component assigned to the layer of the plurality of layers;
        receiving information about an event related to the datacenter occurring independent of the plurality of datacenter components, the event affecting an amount of the resource available;
        in response to receiving the information about the event, determining, based at least in part on the information on usage of the resource in the accessed layer information associated with at least one layer, a change to operation of datacenter components assigned to the at least one layer such that usage of the resource by datacenter components of the plurality of layers does not exceed the total amount of the resource available; and
        changing operation of the determined at least one layer of the plurality of layers.

2. The computer-implemented method of claim 1, wherein changing operation comprises changing a processor state associated with the datacenter components.

3. The computer-implemented method of claim 2, wherein the processor state comprises at least one of processor performance state (P-state), processor operating state (C-state), or processor sleep state (S-state).

4. The computer-implemented method of claim 1, wherein changing operation comprises changing at least one of a device or global state associated with the datacenter components of the at least one layer of the plurality of layers.

5. The computer-implemented method of claim 1, wherein changing operation comprises shutting down the datacenter components of the at least one layer of the plurality of layers.

6. The computer-implemented method of claim 1, wherein changing operation comprises slowing down operation of the datacenter components of the at least one layer of the plurality of layers.

7. A computer-implemented method for managing components in a computing environment, comprising:
    under the control of one or more computer systems configured with executable instructions,
        receiving an indication of at least one computer component and a criticality level of the at least one computer component; and
        in response to receiving information about an event in a computing environment affecting an amount of a common resource available, the computing environment comprising a network of a plurality of computer components sharing the common resource that includes the at least one computer component:
            accessing information about the plurality of computer components in the computing environment and a plurality of layers, the information including, for each of the plurality of computer components, an assigned one of the plurality of layers for the computer component, the one of the plurality of layers having been assigned based at least in part on a criticality of the computer components to the computing environment;
            determining a resource usage of the common resource for each layer of the plurality of layers from operational characteristics of each datacenter component, the operational characteristics provided by each datacenter component assigned to the layer of the plurality of layers;
            determining at least one critical layer of the plurality of layers based at least in part on the criticality of the computer components in the at least one critical layer, the at least one critical layer determined such that the resource usage of the computer components in said at least one critical layer is below the amount of the common resource available; and
            causing operation to change for at least some of the plurality of computer components in accordance with the assigned layer for the computer component, the at least some of the plurality of computer components being assigned to layers other than the at least one critical layer.

8. The computer-implemented method of claim 7, wherein causing operation to change comprises reducing power consumption of said at least some of the plurality of computer components.

9. The computer-implemented method of claim 7, wherein causing operation to change comprises changing operation of computer components assigned to one and only one layer of the plurality of layers in response to the event.

10. The computer-implemented method of claim 7, wherein causing operation to change comprises changing a processor state associated with the computer components.

11. The computer-implemented method of claim 7, wherein causing operation to change comprises changing computer components assigned a first layer to a first altered state and changing computer components assigned a second layer to a second altered state that is different than the first altered state.

12. The computer-implemented method of claim 7, wherein causing operation to change comprises at least one of shutting down, slowing, or putting to sleep the computer components.

13. A datacenter environment, comprising:
a plurality of datacenter components;
a data store for maintaining information about the plurality of datacenter components and a plurality of layers, the information including, for each of the plurality of datacenter components, an assigned one of the plurality of layers for the datacenter component selected by a third party and operational characteristics of each of the plurality of datacenter components provided by the datacenter components; and
a management component, comprising:
at least one memory that stores computer-executable instructions; and
at least one processor configured to access the at least one memory, wherein the at least one processor is configured to execute the computer-executable instructions to collectively at least:
in response to receiving information about an event in the datacenter environment affecting an amount of a resource available to the datacenter components, access the information to identify at least one critical layer of the plurality of layers sustainable by the amount of the resource available to the datacenter components based on the operational characteristics of each of the plurality of datacenter components assigned to the at least one critical layer; and
cause operation to change for at least some of the plurality of datacenter components, the at least some of the plurality of datacenter components being those not assigned to the at least one critical layer.

14. The datacenter environment of claim 13, wherein causing operation to change for at least some of the plurality of datacenter components comprises changing a processor state associated with the datacenter components.

15. The datacenter environment of claim 14, wherein the processor state comprises at least one of processor performance state (P-state), processor operating state (C-state), or processor sleep state (S-state).

16. The datacenter environment of claim 13, wherein causing operation to change for at least some of the plurality of datacenter components comprises changing at least one of a device or global state associated with the datacenter components.

17. The datacenter environment of claim 13, wherein causing operation to change for at least some of the plurality of datacenter components comprises shutting down the datacenter components.

18. The datacenter environment of claim 13, wherein causing operation to change for at least some of the plurality of datacenter components comprises slowing down operation of the datacenter components.

19. One or more non-transitory computer-readable media storing computer-executable instructions for managing components in a computing environment that, when executed by one or more computer systems, configure one or more computer systems to perform operations comprising:
in response to receiving information about an event in a computing environment resulting in a decrease to an amount of resource available:
accessing information about a plurality of computer components in the computing environment and a plurality of layers, the information including, for each of the plurality of computer components, an assigned one of the plurality of layers for the computer component selected by a third party and operational characteristics of the computer component provided by the computer component;
determining, for each layer in the plurality of layers, resource usage information based on operational characteristics of each computer component assigned to the layer;
determining at least one critical layer of the plurality of layers based at least in part on a criticality level associated with the at least one critical layer and a resource usage of the at least one critical layer, the at least one critical layer determined such that the amount of the resource available is sufficient to maintain the determined critical layer; and
causing operation to change for at least some of the plurality of computer components, the at least some of the plurality of computer components being assigned to layers of the plurality of layers other than the critical layer.

20. The one or more computer-readable media of claim 19, wherein causing operation to change comprises reducing power consumption of said at least some of the plurality of computer components.

21. The one or more computer-readable media of claim 19, wherein causing operation to change comprises causing a change in operation of one and only one layer of the computer components in response to the event.

22. The one or more computer-readable media of claim 19, wherein causing operation to change comprises causing a change to a processor state associated with the computer components.

23. The one or more computer-readable media of claim 19, wherein causing operation to change comprises causing a change to computer components assigned a first layer to a first altered state and changing computer components assigned a second layer to a second altered state that is different than the first altered state.

24. The one or more computer-readable media of claim 19, wherein causing operation to change comprises at least one of shutting down, slowing, or putting to sleep the at least some of the plurality of computer components.

* * * * *